United States Patent [19]

Barbee et al.

[11] Patent Number: 4,781,970

[45] Date of Patent: Nov. 1, 1988

[54] STRENGTHENING A CERAMIC BY POST SINTER COATING WITH A COMPRESSIVE SURFACE LAYER

[75] Inventors: Steven G. Barbee, Dover Plains, N.Y.; Hung-Chang Huang, San Jose, Calif.; Donald J. Hunt, Middletown, N.Y.; Jungihl Kim, Peekskill, N.Y.; Jae M. Park, Mahopac, N.Y.; Charles H. Perry; Da-Yuan Shih, both of Poughkeepsie, N.Y.

[73] Assignee: International Business Machines Corporation, Armonk, N.Y.

[21] Appl. No.: 73,620

[22] Filed: Jul. 15, 1987

[51] Int. Cl.[4] .................. B32B 3/00; B32B 15/00; B32B 9/00; C03B 29/00

[52] U.S. Cl. .................. 428/210; 428/432; 428/426; 428/542.8; 428/678; 428/901; 156/89; 106/287.16; 106/287.18; 106/287.34

[58] Field of Search .................. 156/89; 106/287.16, 106/287.18, 287.34; 428/428, 432, 426, 542.8, 210, 698, 901, 699

[56] References Cited

U.S. PATENT DOCUMENTS

| | | | |
|---|---|---|---|
| 3,652,378 | 3/1972 | Mistle | 161/182 |
| 3,879,509 | 4/1975 | Elderbaum | 264/56 |
| 3,998,617 | 12/1976 | Gliemeroth | 65/33 |
| 4,203,733 | 5/1986 | Tanaka et al. | 51/295 |
| 4,277,522 | 7/1981 | Dorfeld | 427/292 |
| 4,507,392 | 3/1985 | Rittler | 501/4 |
| 4,624,896 | 11/1986 | Watanabe et al. | 428/428 |
| 4,703,024 | 10/1987 | Aronov | 501/103 |

OTHER PUBLICATIONS

Making High Strength Ceramics, B. Schwartz, IBM Technical Disclosure Bulletin, vol. 11, No. 7, Dec. 1968.

Localized Compressive Layer Strength Enhancement in Multilayered Glass-Ceramic Substrates with the Use of Screening, Research Disclosure, Aug. 1986, No. 268, Kenneth Mason Publications Ltd., England.

*Primary Examiner*—John E. Kittle
*Assistant Examiner*—P. J. Ryan
*Attorney, Agent, or Firm*—Daniel P. Morris

[57] ABSTRACT

Strengthened ceramic and a method for increasing the mechanical strength of fully sintered ceramic articles, in particular alumina type ceramic and glass-ceramic articles. Such articles are strengthened by forming a compresssive material layer of amorphous silicon dioxide or refractory metal nitride on the surface of the article to be strengthened.

47 Claims, No Drawings

STRENGTHENING A CERAMIC BY POST SINTER COATING WITH A COMPRESSIVE SURFACE LAYER

FIELD OF INVENTION

This invention relates to a strengthened ceramic article and to a method for making stress resistant ceramic articles such as glass-ceramic articles by depositing onto a fully sintered ceramic article a compressive surface layer. These strengthened articles are useful as ceramic substrates for semiconductors provided with very large scale integrated circuits (VLSI).

DESCRIPTION OF THE PRIOR ART

Ceramics play an important role in the electronics industry. Due to their well known insulating properties ceramics are used as supporting bodies known an substrates for electronic devices and circuits. In particular, circuits fabricated on semiconductor chips, such as silicon chips, are electrically mounted on ceramic substrates which are electrically connected to printed circuit boards.

Desirable properties of a ceramic material used as a substrate are a thermal coefficient of expansion (TCE) of approximately the same value as the semiconductor chip mounted thereon and a low dielectric constant.

It is important that the semiconductor chip and the ceramic substrate to which it is mounted both have TCEs which are approximately the same value in order to minimize stress between the chip and the substrate caused by thermal cycling during processing and during use of the assembly of chip, substrate and circuit board.

Dielectric properties of the ceramic substrate are also important. As the density of circuits increases on a semiconductor chip, the number of input/output connectors to the chip increase and the spacing between such connectors decreases. Consequently, metal connectors in the ceramic for connection to the chip input/output connectors are more closely spaced. Also, such high density chips any require substrates with many layers of patterned conductors. Closer spacing increases the capacitive coupling between input/output connectors and between conductors within the substrate. The increased capacitive coupling causes signal propagation delay which can be reduced by using a ceramic having a lower dielectric constant for the substrate.

A typical prior art material used for such ceramic substrates is alumina, $Al_2O_3$. A sintered alumina ceramic is composed of crystalites of a single crystal phase randomly arranged to form a polycrystalline material. This material has a thermal expansion coefficient sufficiently different than that of silicon, which can affect the integrity of chip to substrate connections over time.

Glass-ceramics have been intensively studied in the last few years as a replacement for the prior art alumina type ceramic substrates. Glass-ceramics generally have lower dielectric constants, lower thermal expansion coefficients (having closer values to that of silicon) and lower sintering temperatures than alumina. In general, glass-ceramics have a microstructure that can be described as composed of networks that are highly crystalline, the interstices of which are occupied by small amounts of the residual glass and some discrete secondary crystallites.

The main problem of glass-ceramics is low fracture strength. Ceramic substrates with semiconductor chips mounted thereon are electrically connected to a printed circuit board by means such as metal pins. The pins are joined to metal pads on the ceramic substrate by methods such as brazing which typically uses a brazing alloy sandwiched between the pin and pad to promote bonding. During brazing, the metal pin, the metal pad, and the region of the ceramic local to the metal pad are heated to a higher temperature. Since the metal pad and brazing alloy have thermal coefficients of expansion greater than the ceramic substrate, stress is generated in the ceramic in the region of contact with the metal connector. For a sufficiently high temperature and large enough difference in thermal coefficient of expansion the glass-ceramic in such region may fracture causing the pins to loosen at low externally applied stress.

To increase ceramic strength B. Schwartz in "Making High Strength Ceramics" IBM Technical Disclosure Bulletin Vol. 11, No. 7, 848 (December 1968), describes placing the surfaces of a ceramic material in compression relative to the central portions of the article by altering the composition of the outer layers of at least three layers of green ceramic material by adding chromium to the alumina, prior to sintering. The ceramic materials are used as substrates for microelectronic devices.

U.S. Pat. No. 3,652,328 to Mistle describes a mehod of strengthening alumina substrates by incorporating grain growth inhibitors in a surface layer of the alumina substrate and incorporating grain growth promoters in the bulk alumina substrate. The surface layer thickness is greater than 120 microns. Upon sintering of the composite structure a compressive surface layer is formed. The compressive surface layer is thus cosintered with the substrate which is being strengthened. The method of this invention is suitable for a single phase ceramic such as alumina. It has been found that attempts to form compressive layers on a multi-phase glass-ceramic by cosintering with a surface layer formed by incorporating additives into the surface results in surface layer compression characteristics which are not easily controllable. For example, the compressive stress has a large variation from sample to sample. This variation is attributed to the multiphase structure of the glass-ceramic. It is believed that the compressive characteristic of a multiphase structure such as a glass ceramic is not as easily controlled by additives as it is for a single phase ceramic such as alumina.

Glass-ceramic materials are disclosed in U.S. Pat. No. 4,301,324 to Kumar et al. and the processes for making such glass-ceramic materials are disclosed in U.S. Pat. No. 4,413,061 to Kumar et al. Of the two types of glass-ceramics disclosed in the aforesaid U.S. Pat. Nos. 4,301,324 and 4,413,061, one has spodumene, $Li_2O.Al_2O_3.4SiO_2$, as the principal crystalline phase while the other has cordierite, $2MgO.2Al_2O_3.5SiO_2$, as the principal crystalline phase. A common feature of these sintered glass-ceramics, among others, is their excellent sinterability and crystallization below 1,000° C. and their low dielectric constants.

The terms spodumene glass and cordierite glass as used herein refer to the uncoalesced green glass. The terms spodumene glass-ceramic and cordierite glass-ceramic as used herein refer to the coalesced glass-ceramic.

U.S. Pat. No. 4,277,522 of Dorfeld for "Coating Glass-Ceramic Surfaces" describes a skillet of glass-ceramic cookware which is fabricated from a green sheet of glass-ceramic material which is roughened and coated on the roughened surface with a layer of silicon. The surface is roughened to promote adhesion of the silicon layer. Roughening is done before firing is complete to heal damage introduced by the roughening which results in a degradation of the physical and thermal properties of the glass ceramic. The silicon coating is deposited any time after surface roughening, including after complete firing of the green glass. The purpose of the silicon coating is to enhance the thermal conductivity of a glass-ceramic article used for cookware thereby promoting uniform heating of food being cooked therein. The silicon coating is not deposited to enhance the strength of the glass-ceramic article. Moreover, since the silicon coating TCE cited by Dorfeld exceeds the glass-ceramic skillet TCE cited by Dorfeld, the silicon coating cannot form a strengthening compressive layer.

U.S. Pat. No. 3,998,617 to Gliemeroth describes a method to form a compressive layer of crystal phases of lithium-aluminum-silicate on a fully formed lithia-aluminum-silicate glass article. The mechanical strength of the glass article is improved by applying to its surface a liquid containing compounds which through hydrolysis and pyrolysis are convertible into crystalline lithium aluminum-silicate. The conversion is accomplished by first heating the coated substrate to drive off solvents in the liquid. The article is then heated at a higher temperature and for a sufficient time to cause through epitaxy of crystalline lithium-aluminum-silicate the formation upon the substrate of crystal phases of lithium-aluminum-silicate which have a lower TCE than the substrate which on cooling form a compressive surface layer. The compressive layer thicknesses formed by this method are greater than 180 microns. Also, to achieve epitaxial growth, the liquid deposited on the substrate must contain a stoichmetric mixture of the components of the lithia-aluminum-slicate crystallites contained in the substrate. The dielectric constant of a lithia-aluminum-silicate glass surface layer is approximately 5. For application to a high performance semiconductor chip substrate applications it is desirable to deposit a compressive layer of the lowest dielectric constant possible. However, materials having dielectric constants of 5 or greater can be used.

Thus, while the prior art describes attempts to strenghten ceramic materials, and particularly through the use of compressive layers on the ceramic, these attempts do not provide satisfactory solutions where the ceramic is to be used as a substrate in the microelectronics industry. For example, the prior art techniques often are complex and costly, requiring thick compressive layers, and do not provide compressive layers having a sufficiently low dielectric constant, or sufficiently uniform characteristics from sample to sample.

In order to overcome these problems, the method described in the present invention deposits a compressive layer on a ceramic article after the green ceramic is fired to form the sintered ceramic material, i.e., after it is fully sintered. This technique is particularly useful for forming compressive layers on alumina ceramics and glass-ceramics. The glass-ceramics of the present invention include but are not limited to the spodumene glass-ceramic or cordierite glass-ceramic as described in the Kumar et al. patents. The teachings of both these patents are incorporated herein by reference. The presently described invention forms a compressive layer on a fully sintered ceramic. Unlike the prior art, the compressive layer has a different composition than that of the substrate and a stoichiomeric mixture is not required. The compressive layers of the present invention are very thin; therefore, the effective dielectric constant of the coated ceramic article is not substantially different than the dielectric constant of the ceramic article itself which is about 5 for a glass-ceramic and about 10 for alumina.

The compressive layers of this invention are substantially thinner than prior art compressive layers which are greater than 100 microns thickness. Quite unexpectedly it has been found that using the material layers of the present invention, amorphous silicon dioxide and refractory metal nitrides, compressive layers of only a few hundred angstroms thickness are sufficient to strengthen brittle glass-ceramics enough to avoid cracking during pin brazing.

The only prior art which remotely suggests that thinning a compressive surface layer results in higher compression is "Localized Compressive Layer Strength Enhancement with the Use of Screening", Rearch Disclosure, August, 1986, No. 268, Kenneth Mason Publications Ltd. England. This article is an example of cosintering the compressive layer with the substrate on which it is deposited. Since the thickness of the compressive layer is not given, prior art thicknesses of greater than 100 microns are what must be intended. If thicknesses substantially less than prior art thicknesses were contemplated to enhance the strength of the substrate, the article would have indicated this unexpected result.

It has also been found that ceramic article strengthening by the method of the present invention is not caused by the thin surface layer filling in fine surface flaws, some of which are referred to as Griffith flaws. While it might be expected that filling in surface flaws with a material of higher or lower TCE than that of the substrate will inhibit the tendency of a ceramic to crack when stressed, test proved otherwise. When a thin material layer of larger TCE than that of the ceramic substrate was deposited onto the substrate surface, the ceramic strength was found to decrease. On the other hand, when a thin material layer of smaller TCE than that of the substrate was deposited onto the substrate, the ceramic strength was found to increase. This result is not expected if the thin surface layer strengthens the ceramic by filling in the surface flaws. The higher TCE material forms a surface layer in tension which was found to reduce the fracture strength of the substrate. While the lower TCE material forms a surface layer in compression which increases the strength of the substrate.

It has also been found, quite unexpectedly, that compressive layers sufficient to avoid such cracking can be formed by sputter depositing these materials onto an unheated substrate. A compressive layer is formed when the substrate with a material layer of lower TCE thereon is cooled from a higher to a lower temperature. Material which is sputtered is heated by the sputtering process. It is unexpected that a thin material layer sputtered onto an unheated substrate can have sufficient heat to raise the temperature of the surface on which the sputtered material is deposited to form a compressive layer. Material layers particularly effective in forming compressive layers on a spodumene glass-ceramic or a cordierite glass-ceramic are amorphous silicon dioxide and refractory metal nitrides.

It is an object for this invention to provide an improved method for enhancing the strength of a fully sintered ceramic article, in particular a glass-ceramic article, by forming a compressive surface layer thereon.

It is another object of this invention to strengthen a fully sintered ceramic article by means of a compressive layer of different composition than the ceramic article, wherein the compressive layer is very thin and does not substantially change the effective dielectric constant of the coated ceramic article.

It is another object of this invention to use such a strengthened ceramic article as a supporting substrate for a semiconductor chip.

It is another object of this invention to provide an improved technique for strengthening a ceramic article which provides effective strengthening from sample-to-sample in a simple inexpensive manner.

SUMMARY OF THE INVENTION

In its broadest aspect, this invention is a strengthened ceramic article and a method for improving the mechanical strength of a sintered ceramic article. The strengthened article has a compressive surface layer thereon. The method comprises the steps of fully sintering the ceramic article and thereafter heating the article to a temperature which is less than the sintering temperature, the temperature at which the green ceramic is transformed to the ceramic, but greater than the temperature at which the strengthened article is used. Either prior to heating the ceramic article or simultaneously with heating the ceramic article or in a subsequent step to such heating, a layer of material is deposited on parts of the ceramic surface which are to be strengthened. Chemical vapor deposition, sputter deposition and spin deposition can be used to deposit the said material layer which has a thermal coefficient of expansion which is less than that of the ceramic article. On cooling of the coated ceramic article a compressive surface layer forms since the material layer contracts less than the ceramic article. The layer of deposited material does not have to be continuous, to effectively act as a compressive layer.

This invention is particularly effective to strengthen alumina and glass-ceramic articles by depositing on the surface to be strengthened a compressive layer of amorphous silicon dioxide or a layer of a refractory metal nitride.

In accordance with another more particular aspect of the present invention a continuous compressive layer is formed on part of the surface of a ceramic article used as a substrate on which a semiconductor chip or the like is mounted. The compressive layer is formed on that part of the substrate to which a means, such as a metal contact pad and metal pin, is attached for electrical connection of the substrate to a printed circuit board. The compressive layer strengthening is necessary to avoid ceramic fracture resulting from high stresses generated by pin brazing.

DETAILED DESCRIPTION OF THE PREFERRED EMBODIMENT OF THE INVENTION

For convenience the present invention will be described in terms of increasing the strength of a ceramic substrate, in particular, a glass ceramic substrate which is used for a packaging substrate for a semiconductor chip for very large scale integration (VLSI). However, it should be understood that the invention extends to many uses other than substrates for semiconductor chips and is suitable for any use wherein a strengthened material is required. Any material can be strengthened by depositing a surface compression layer thereon. The method described herein forms the compression layer on a fully sintered material. For the purpose of this description a fully sintered material is a material which is in a physical state for which it is intended to be used. For example, a fully sintered material for use as a substrate for support of and electrical connection to a microelectric semiconductor chip is a fully sintered ceramic such as alumina or a fully sintered glass-ceramic.

The article which is strengthened by the compression layer is referred to herein as a substrate. Strengthening of the substrate occurs in the following manner. The substrate is heated to a temperature above which it will be used for its intended purpose. However, the temperature is not raised above the sintering temperature, the temperature at which the substrate degrades or physically changes. A material layer having a thermal coefficient of expansion less than that of the substrate is deposited on the substrate which is to be strengthened. Such a layer is herein referred to as a compression layer. The deposited material adheres, either physically, chemically or by other means, to the substrate surface. The step of heating the substrate and depositing the material layer can be combined into one step, for example by depositing a material layer which is hot onto a substrate which is at a lower temperature. Such a hot layer of material will heat the surface of the substrate on which it is deposited. When the coated substrate cools the surface layer contracts less than the substrate resulting in a compression of the surface layer. The substrate is coated at a temperature higher than the substrate operating temperature, the temperature at which the coated substrate is used, so that the surface remains in compression at the operating temperature. It is not necessary for the compression layer to be continuous. A layer consisting of islands of closely spaced regions of adherent material will result in a compression layer on the surface of the substrate. The substrate surface under the compression layer is in tension. A substantially continuous layer having larger more closely spaced islands is a more effective compression layer. A continuous layer is most effective.

There is a minimum and a maximum thickness of the deposited layer for it to function as a compressive layer. The deposited layer has lower TCE than the substrate and, therefore, it contracts less than the substrate on cooling. As a result of this differential contraction the surface layer is compressed and the substrate surface in contact with the layer is in tension. If the surface layer is very thin, it will be maximally compressed and the substrate surface will be minimally in tension. For a perfectly smooth substrate surface, a lower TCE material of a monolayer thickness, if sufficiently continuous, will form a compressive layer on cooling. The minimum layer thickness is determined by the substrate surface roughness. To provide compression the surface layer must be at least as thick as the surface roughness. As the layer thickness increases the layer becomes more resistant to compression. At the maximum layer thickness, as the substrate contracts on cooling, the tension is great enough to degrade the substrate surface. For example, large enough surface tension can cause cracks or fractures in the substrate surface which weaken the substrate. If the degradation is large enough, the tension will be completely relieved and the surface layer will not be compressed. In this situation, the surface layer is not a compressive layer.

For the preferred material layers, amorphous silcon dioxide and refractory metal nitrides, the preferred thickness range is from about 200 angstroms to about 2 microns. However, layers as thin as a monolayer and as thick as 25 microns or larger form compressive layers.

The fracture strength of such a coated substrate is measured by the standard three point bend test ASTM standard E855 described in the Annual Book of ASTM Standards, Vol. 03.01 p. 787, ASTM, Philadelphia, Pa. A compressive layer is deposited on a surface of a substrate. The three point bend test consists of applying two fixed points to the coated surface and to the uncoated surface a third point is applied midway between the points applied to the coated surface. A force is applied to the third point directed from the uncoated to the coated surface. The force at which the substrate fractures is measured. As described hereinbelow, the fracture strength of coated substrates significantly exceeds that of uncoated substrates.

By means commonly known in the art a ceramic substrate is fully sintered to form a ceramic from a green ceramic material. Commonly used ceramic materials are alumina, $Al_2O_3$, and glass-ceramics. Examples of glass ceramics, useful to practice the presently described invention are composed predominantly of spodumene type glass-ceramics and a cordierite type glass-ceramics. Examples of formulations of such glass-ceramics are found in U.S. Pat. No. 4,301,324 to Kumar et al and U.S. Pat. No. 4,413,061 to Kumar et al.

Strengthening of a ceramic substrate is particularly important for glass-ceramics which are generally less tough than other ceramics such as alumina. As noted above, because of their dielectric constant and thermal coefficient of expansion, glass-ceramics are preferable to ceramics such as alumina as packaging substrates for semiconductor chips. However, the brittleness of such glass ceramic substrates (due to surface flaws such as Griffith flaws) substantially reduces manufacturing yield. Surface strengthening as described herein is useful to avoid the undesired results of such brittleness to improve glass-ceramic substrate yield.

In one preferred embodiment of the invention, a ceramic substrate is covered with a layer of vitreous silicon dioxide, fused silica or vitreous silica, all of which are referred to herein as amorphous silicon dioxide. This layer can be deposited by chemical vapor deposition (CVD), by sputter deposition and by spinning onto the substrate an organic solution of silica. As is expected and indicated in the patent to Dorfeld, referred to hereinabove, silicon dioxide chemically or physically adheres to substrates composed of oxides, such as ceramics substrates.

It is commonly known in the art that chemical vapor deposition of fused silica can be accomplished by decomposing tetraethyloxysilane (TEOS) in a low pressure chemical vapor deposition furnace. The substrate to be coated is placed in the CVD furnace. The substrate is heated to a temperature greater than about 100° C. but less than the sintering temperature of the ceramic substrate. The lower bound of 100° C. is about the maximum operating temperature of a ceramic substrate with a semiconductor chip mounted thereon for use in an electronic computing machine and the like. The sintering temperature of a spodumene type or cordierite type glass-ceramic described herein above is about 920° C. to 970° C. The sintering temperature of alumina is about 1400° C.

The substrate is heated to a temperature below the sintering temperature to avoid physically changing the substrate which in the case of a glass-ceramic is melting. The preferred temperature range for TEOS CVD is from 725° to 750° C. and the preferred gas pressure is about 1 torr. It is understood that these temperatures and pressures are exemplary and not limiting. Any means commonly known in the art can be used for heating the substrate, such as resistive heating and exposure to infrared radiation. TEOS vapor flows into the CVD chamber and decomposes to vitreous silicon dioxide conformally coating the hot substrate surface. The deposited silicon dioxide has a thermal coefficient of expansion of about $0.6 \times 10^{-6}/°C$. The glass-ceramic has a thermal coefficient of expansion of about $2.6 \times 10^{-6}/°C$. Upon cooling to room temperature the deposited layer contracts less than the substrate forming a compressive layer thereon. The rate of deposition of the silica layer is controlled by the substrate temperature, the gas flow rate and gas pressure. Layers of 2,000 Angstrom to 5,000 Angstrom have been deposited with the substrate at 725° C., a gas flow rate of 400 sccm and gas pressure of 1 torr. It is within the skill of art to adjust flow rate and temperature to deposit a specific film thickness. Fracture strength of the fabricated glass-ceramic were measured by the standard three point bend test. The strength of a glass-ceramic with such a compressive layer is found to be 30% to 40% higher than the same substrates without the compressive layer. CVD of fused silica on the substrate surface by decomposition of TEOS is exemplary only and not limiting. Any method of depositing fused silica is effective in depositing a compressive layer. The following table list a number of chemical species with substrate temperature and gas pressure which are effective in depositing by CVD a compressive silicon dioxide layer on a ceramic substrate such as alumina or a glass-ceramic.

| CHEMISTRY | TEMPERATURE (°C.) | PRESSURE (Torr) |
|---|---|---|
| $N_2O$, $SiH_2Cl_2$ | 930 | <1 |
| $CO_2$, $SiH_4$, (HCl) | 1,000 | 760 |
| $O_2$, $SiH_4$ | 435 | <1 |
| DADBS diacetoxydibutoxysilane | 400–600 | 1 |

Another method of depositing a fused silica layer is by RF sputter deposition. Sputter deposition is commonly known in the art. The substrate to be coated is placed in the sputter deposition chamber with the side of the substrate to be coated facing a silicon dioxide target. By means of an electric field, ions are directed towards the target sputtering off the silicon dioxide which is deposited on the face of the substrate facing the target. It is commonly known in the art how to control the thickness of a sputter deposited film. During sputter deposition the substrate can be heated in situ by means such as resistive heating or a quartz lamp to a temperature greater than about 100 degrees centigrade but less than the sintering temperature. The substrate is allowed to cool and the vitreous silicon dioxide film forms a compressive layer on the substrate. It has been found that in situ heating is not necessary to form a compressive layer. During sputter deposition material sputtered from the silicon dioxide target is heated to an elevated temperature. The material heats the substrate on which it is deposited. When the substrate is removed from the deposition chamber it cools to room temperature forming a compressive layer of vitreous silicon dioxide. For a 1,000 Angstrom layer of silica RF sputtered onto a glass ceramic, the three point bent test showed about 10% increase in strength.

As another example, a thin vitreous silicon dioxide film is formed on a ceramic surface by coating the ceramic surface with a colloidal dispersion in liquid media of fine silica particles. The coated substrate is heated to a temperature sufficient to drive off the liquid media. The silica particles chemically, physically or by other means adhere to the substrate surface. The temperature is less than that needed to bind the silica particles together. The temperature of the substrate is then raised to a temperature necessary to bind the silica particles together forming a substantially continuous compressive layer. If the temperature is initially raised to the latter temperature, the compressive layer may peel off the substrate because of blistering caused by the liquid media boiling under the layer of silica particles which are bound together. As an example of this method, a spinable glass, General Electric silica hard coating 1010(SHC1010), is spin coated on the substrate surface at 3,000 rpm for 30 seconds. SHC1010 is a colloidal dispersion of ultra fine silica in an organic medium. This material contains a small amount of organic dispersion agent. The organic solvent is evaporated, typically at 80° C. for 30 minutes. A compact silica film of the ultra fine silica particles is formed. Under the spinning conditions employed, about a 5,000 Angstrom thick silica film is formed. However the thickness of the silica layer can be easily controlled by changing the spinning conditions or silica content of the solution. The spin coated samples are then heated to the sintering temperature of the substrate, for one hour in air to burn off all the organic medium except silica. The second heating step results in the fusion or adhesion of the fine silica particles to form a substantially continuous compressive layer when the coated ceramic is cooled.

The strength of SHC1010 treated samples was measured by the standard three point bend test. Spodumene and cordierite glass-ceramic substrates coated with a compressive layer as described herein above were found to have a strength 26% greater than uncoated substrates.

By techniques commonly known in the art refractory metal nitrides, for example tantalum nitride (TaN), titanium nitride (TiN), zirconium nitride (ZrN) and hafnium nitride (HfN) can be sputter deposited. Such materials are useful to form adherent compressive layers on a ceramic. Refractory metal nitrides are believed to adhere to the ceramic article surface by chemical reaction of the metal constituent with oxygen in the ceramic substrate. Such sputtering deposits a polycrystalline layer which forms an effective compressive layer. An amorphous or crystalline layer is also effective as a compressive layer.

The strength of a sputter deposited TaN compressive layer of 1,500 angstroms thickness on an unheated glass-ceramic substrate is found to be 20% higher than an uncoated substrate as measured by the standard three point bend test. Sputter deposition deposits hot TaN onto the unheated substrate surface. The hot TaN heats the surface. A compressive layer is formed on cooling. Sputter deposition onto a hot substrate surface will increase the degree of surface compression and substrate fracture strength thereby. It is within the skill of the art to determine for a particular ceramic substrate the optimum sputtering conditions.

As described hereinabove, the thin surface layer was found not to strengthen the ceramic article by filling in surface flaws. When a thin layer of $TiO_2$, having a TCE ($9 \times 10^{-6}$/°C.) greater than the substrate was deposited thereon, the three point bend test showed the ceramic fracture strength decreased.

The techniques described above can be specifically applied to a ceramic packaging substrate for a semiconductor chip, in particular to a multilayered glass-ceramic substrate with metal conductors between such layers which are extended to at least one surface of the substrate. Such a substrate with a semiconductor chip mounted thereon provides means for electrical connection between the circuit and device elements of the semiconductor chip and a printed circuit board by means of metal conductors on and within the substrate. Such a substrate is electrically connected to a printed circuit board by means of conductive pins which are joined to metal connectors which adhere to the ceramic surface and which are in electrical connection with the metal conductors of the substrate. Metal pins are joined to the metal connectors by brazing during which the pin, connector and substrate are heated. The metal connector and pin have a thermal coefficient of expansion greater than the ceramic substrate. In the case of a glass-ceramic the differential expansion is sufficient to fracture the brittle glass-ceramic in the region of contact of the metal connector and the substrate. The methods described herein are useful to avoid such fracture. A compressive layer is deposited on the ceramic substrate on the surface on which metal connectors are formed. The compressive layer can be deposited an enlarged pads beneath the metal contact pads or as a blanket layer covering the contact pad area or in any suitable pattern to extend under all contact pads as desired. The compression layer strengthens the substrate because the stress needed to cause the ceramic to fail when the pad expands during pin brazing must first overcome the built-in compression of the layer and then exceed the strength of the substrate material.

While the invention has been particularly shown and described with reference to preferred embodiments thereof, it will be understood by those skilled in the art that changes in form and detail may be made therein without departing from the spirit and scope of the invention.

Having thus described our invention, what we claim as new and desire to secure as Letters Patent is:

1. An article strengthened by a compressive surface layer comprising:
   a fully sintered ceramic; and
   a coating of material disposed over at least a part of the surface of said article after said ceramic has been fully sintered, said material being selected from the group consisting of amorphous silicon dioxide and refractory metal nitrides, said coating forming a compressive layer on said part of said article, said coating being at least as thick as the surface roughness of said part.

2. An article strengthened by a compressive surface layer comprising:
   a fully sintered ceramic; and
   a coating of material disposed over at least a part of the surface of said article after said article has been fully sintered, said material layer having a thickness from one monolayer to about 25 microns, said coating forming a compressive layer on said part of said article, said coating being at least as thick as the surface roughness of said part.

3. The article of claim 1, wherein said ceramic is selected from the group consisting of spodumene type glass-ceramics, cordiertie type glass-ceramics and alumina type ceramics.

4. The article of claim 1, further including conductor patterns therein and at least one means for extending said patterns to said surface of said ceramic.

5. The article of claim 4, wherein at least one of said means extends through said compressive layer on at least one of said parts of said ceramic surface.

6. The article of claim 4, further including conductive metal pins physically and electrically connected to said means for extending said conductor patterns, said pins projecting outwardly from said article surface.

7. The article of claim 1, wherein said coating has a thickness between about 200 angstroms to about 2 microns.

8. The article of claim 1, wherein said coating is continuous.

9. The structure of claim 1, wherein said coating is a group of islands of continuous material.

10. The structure of claim 1, wherein said coating is substantially continuous.

11. The structure of claim 2, wherein said coating is continuous.

12. The structure of claim 2, wherein said coating is a group of islands of continuous material.

13. The article of claim 2, wherein said ceramic is selected from the group consisting of spodumene type glass ceramics, cordierite type glass ceramics and alumina type ceramics.

14. The article of claim 2, further including conductor patterns therein and at least one means for extending said patterns to said surface of said ceramic.

15. The article of claim 14, wherein at least one of said means extends through said compressive layer on at least one of said parts of said ceramic surface.

16. The article of claim 14, further including conductive metal pins physically and electrically connected to said means for extending said conductor patterns, said pins projecting outwardly from said article surface.

17. The article of claim 1, wherein said coating has a thermal coefficient of expansion lower than said part of the surface of said article.

18. The article of claim 2, wherein said coating has a thermal coefficient of expansion lower than said part of the surface of said article.

19. A method for improving the mechanical strength of a fully sintered ceramic article comprising depositing onto at least a portion of said ceramic article a layer of material selected from the group consisting of amorphous silicon dioxide and refractory metal nitrides, said layer adhering to said portion, said portion being heated to a temperature less than the sintering temperature of said ceramic article and above the operating temperature of said ceramic article, said layer having a thermal coefficient of expansion lower than said portion, said layer forming a compressing layer on cooling, said compressive layer being at least as thick as the surface roughness of said portion.

20. A method for improving the mechanical strength of a fully sintered ceramic article comprising depositing onto at least a portion of said ceramic article a layer of material having a thickness from one monolayer to about 25 microns, said layer adhering to said portion, said portion being heated to a temperature less than the sintering temperature of said ceramic article and above the operating temperature of said ceramic article, said layer having a thermal coefficient of expansion lower than said portion, said layer forming a compressive layer on cooling, said compressive layer being at least as thick as the surface roughness of said portion.

21. The method of claim 19, wherein said layer is continuous.

22. The method of claim 19, wherein said layer has a thickness between about 200 angstroms to about 2 microns.

23. The method of claim 19, wherein said ceramic article is selected from the group consisting of cordierite type glass ceramics, spodumene type glass-ceramics and alumina type ceramics.

24. The method of claim 19, wherein said portion is first heated and thereafter said compressive layer is deposited.

25. The method of claim 24, wherein the step of depositing consists of chemical vapor deposition and said material is amorphous silicon dioxide.

26. The method of claim 24, wherein the step of depositing consists of sputter deposition.

27. The method of claim 19, wherein said step of depositing consists of sputter deposition of said compressive layer.

28. The method of claim 19, wherein said portion is heated by depositing a material layer which is at a higher temperature than said portion of said article.

29. The method of claim 19 wherein the said refractory metal nitride is TaN.

30. The method of claim 19, further comprising:
forming conductor patterns within said article;
providing at least one means for extending said patterns to the surface of said article; and
forming said compressive layer on at least a part of said surface.

31. The method of claim 30, wherein at least one of said means extends through said compressive layer.

32. A method for improving the mechanical strength of a fully sintered ceramic article comprising:
coating on at least a portion of said ceramic article a solution of silica particles dispersed in a liquid media;
heating said ceramic article to a temperature less than needed to bind the silica particles together but high enough to evaporate said liquid media leaving silica adherent to the ceramic article surface; and
further heating said ceramic article to a temperature less than the sinter temperature of said ceramic article and above the operating temperature of said ceramic article for a time sufficient to remove all media except silica and to bind the silica particles together to form a compressive layer on cooling, said layer having a thickness at least as thick as the surface roughness of the portion of said ceramic coated with said solution, said layer having a thermal coefficient of expansion lower than said portion.

33. The method of claim 30, further including physically and electrically connecting conductive metal pins to said means for extending said conductive patterns so as to project outwardly from said article surface.

34. The method of claim 19, wherein said layer is a group of islands of continuous material.

35. The method of claim 19, wherein said layer is substantially continuous.

36. The method of claim 20, wherein said layer is continuous.

37. The method of claim 20, wherein said layer is a group of islands of continuous material.

38. The method of claim 20, wherein said layer is substantially continuous.

39. The structure of claim 2, wherein said coating is substantially continuous.

40. The method of claim 20, wherein said ceramic article is selected from the group consisting of cordierite type glass ceramics, spodumene type glass ceramics and alumina type ceramics.

41. The method of claim 20, wherein said portion is first heated and thereafter said compressive layer is deposited.

42. The method of claim 41, wherein the step of depositing consists of chemical vapor deposition and said material is amorphous silicon dioxide.

43. The method of claim 41, wherein the step of depositing consists of sputter deposition.

44. The method of claim 20, wherein said step of depsotiing consists of sputter deposition of said layer of material.

45. The method of claim 20, wherein said portion is heated by depositing a material layer which is at a higher temperature than said part of said article.

46. The method of claim 19, further comprising:
forming conductor patterns within said article;
providing at least one means for extending said patterns to the surface of said article; and
forming said compressive layer on at least a part of said surface.

47. The method of claim 46, wherein at least one of said means extends through said compressive layer.

* * * * *